United States Patent
Balares et al.

(10) Patent No.: US 11,211,266 B2
(45) Date of Patent: Dec. 28, 2021

(54) UNIVERSAL LOAD PORT FOR ULTRAVIOLET RADIATION SEMICONDUCTOR WAFER PROCESSING MACHINE

(71) Applicant: TEXAS INSTRUMENTS INCORPORATED, Dallas, TX (US)

(72) Inventors: Roderick Serafica Balares, Baguio (PH); Marc Jan De Guzman Apilado, Baguio (PH); Reymon Casison, Benguet (PH); Jackson Fernandez Rosario, Baguio (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 425 days.

(21) Appl. No.: 15/272,187

(22) Filed: Sep. 21, 2016

(65) Prior Publication Data

US 2018/0082867 A1     Mar. 22, 2018

(51) Int. Cl.
| | |
|---|---|
| *H01L 21/67* | (2006.01) |
| *H01L 21/673* | (2006.01) |
| *H01L 21/683* | (2006.01) |
| *H01L 21/677* | (2006.01) |
| *B32B 43/00* | (2006.01) |

(52) U.S. Cl.
CPC .. *H01L 21/67132* (2013.01); *H01L 21/67115* (2013.01); *H01L 21/67379* (2013.01); *H01L 21/67775* (2013.01); *H01L 21/6836* (2013.01); *B32B 43/006* (2013.01); *H01L 2221/6834* (2013.01); *H01L 2221/68381* (2013.01)

(58) Field of Classification Search
CPC ......... H01L 21/67132; H01L 21/67775; H01L 21/67115; H01L 21/6836; H01L 21/67379; H01L 2221/68381; H01L 2221/6834; B32B 43/006
See application file for complete search history.

(56) References Cited

U.S. PATENT DOCUMENTS 5,246,524 A * 9/1993 Kuroda ............. H01L 21/67173
                                                                118/35
6,135,698 A * 10/2000 Bonora ............. H01L 21/67775
                                                                414/217.1

(Continued)

FOREIGN PATENT DOCUMENTS

JP        2012064827 A  *  3/2012

OTHER PUBLICATIONS

JP-2012064827A Machine translation of Description (EPO and Google).*

*Primary Examiner* — Cynthia L Schaller
(74) *Attorney, Agent, or Firm* — Jacqueline J. Garner; Charles A. Brill; Frank D. Cimino

(57) ABSTRACT

A semiconductor cassette universal load port. The universal load port comprises a frame, three pins coupled to the frame forming a first portion of a kinematic coupling system configured to locate a 12-inch semiconductor wafer cassette for access by a robot arm of an ultraviolet (UV) radiation (RAD) machine, a first bracket coupled to the frame, a second bracket coupled to the frame, and a chuck coupled to the frame, wherein the first and second bracket and the chuck are configured to locate an 8-inch semiconductor wafer cassette for access by the robot arm of the RAD UV machine.

20 Claims, 6 Drawing Sheets

(56) References Cited

U.S. PATENT DOCUMENTS

| | | | | |
|---|---|---|---|---|
| 6,427,096 | B1 * | 7/2002 | Lewis | H01L 21/67379 414/222.07 |
| 6,432,849 | B1 * | 8/2002 | Endo | H01L 21/6732 438/800 |
| 6,641,348 | B1 * | 11/2003 | Schultz | H01L 21/67775 414/217 |
| 6,830,651 | B2 * | 12/2004 | Obikane | H01L 21/67259 118/719 |
| 7,283,890 | B2 * | 10/2007 | Iijima | G05B 19/41865 700/228 |
| 2003/0088959 | A1 * | 5/2003 | Tsujimoto | H01L 21/67132 29/25.01 |
| 2006/0045663 | A1 * | 3/2006 | Aggarwal | H01L 21/67775 414/217 |
| 2008/0010818 | A1 * | 1/2008 | Narita | H01L 21/67132 29/830 |
| 2009/0087285 | A1 * | 4/2009 | Mitsuyoshi | H01L 21/67766 414/217 |
| 2012/0298549 | A1 * | 11/2012 | Fujimori | H01L 21/67373 206/719 |
| 2014/0308108 | A1 * | 10/2014 | Fosnight | H01L 21/67775 414/800 |
| 2016/0204013 | A1 * | 7/2016 | Ben-Natan | H01L 21/67775 206/722 |
| 2019/0206709 | A1 * | 7/2019 | Li | H01L 21/67706 |

* cited by examiner

UNIVERSAL LOAD PORT FOR ULTRAVIOLET RADIATION SEMICONDUCTOR WAFER PROCESSING MACHINE

BACKGROUND

Semiconductor devices are used in a great variety of devices and equipment in the modern world and serve many useful purposes. Multiple semiconductor devices may be manufactured or fabricated on a single semiconductor wafer and then sawed into individual die. The processes of fabricating semiconductor devices, handling semiconductor wafers, and mounting semiconductor die are highly automated processes. Stiff competition among semiconductor manufacturers leads to steady improvements in handling processes, increases in yields, and reductions in wastage.

Some semiconductor wafer processes involve placing tape on a surface of the wafer. In one process, tape is placed on the circuit side of the wafer to protect the fabricated circuits when grinding down the substrate surface of the wafer to make it desirably thin. In a different process, dicing tape is placed on the substrate side of the wafer to retain the individual die when sawing the wafer into separate die. It may be desirable after these two process steps to cause the adhesive of the tape to weaken, to facilitate removal of the tape after completion of the process step. Some adhesives are employed which can be weakened by exposure to ultraviolet (UV) light. An ultraviolet radiation machine may be used to radiate semiconductor wafers having tape adhered to them to thereby weaken the tape adhesive. This machine may also be referred to as a RAD UV machine.

BRIEF DESCRIPTION OF THE DRAWINGS

For a detailed description of various examples, reference will now be made to the accompanying drawings in which.

DETAILED DESCRIPTION

Figure 1A:
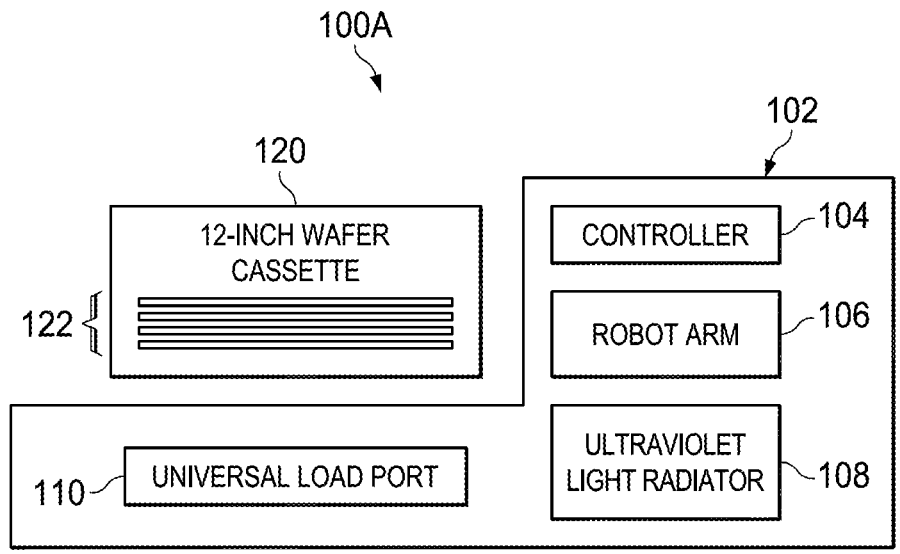
FIG. 1A and FIG. 1B show a universal load port for ultraviolet radiation semiconductor wafer processing machine in accordance with various examples.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

The present disclosure teaches a universal load port for an ultraviolet radiation semiconductor wafer processing machine. The RAD UV machine is used to irradiate tape attached to semiconductor wafers with ultraviolet light, thereby weakening the adhesive of the tape and making it easier to remove that tape from the semiconductor wafer. The RAD UV machine may be used to process wafers of various sizes, for example, 8-inch semiconductor wafers and 12-inch semiconductor wafers. Precise positioning of cassettes containing semiconductor wafers relative to the RAD UV machine is desirable and is provided by the universal load port. Formerly, a first load port was installed on the RAD UV machine to locate and align cassettes containing 8-inch semiconductor wafers and a second load port was installed on the RAD UV machine to locate and align cassettes containing 12-inch semiconductor wafers. In an example commercial process, a single RAD UV machine was used to process both 8-inch and 12-inch wafers, entailing the frequent uninstallation and the reinstallation of alternate load ports. The swapping in and out of load ports may consume a considerable amount of time, thereby reducing processing efficiency. For example, the load ports may be swapped 60 times in a 24-hour processing day and waste about 2 hours per day. The disclosed universal load port is able to precisely locate and align both cassettes containing, for example, 8-inch semiconductor wafers and cassettes containing 12-inch semiconductor wafers, thereby dramatically reducing the amount of manual time spent swapping out alternate load ports of different sizes. The examples below refer to a universal load port configured to accept cassettes for 8-inch and 12-inch wafers, but in general, the universal load port can accept cassettes for wafers of other sizes as well.

The universal load port may also be referred to as a universal load fixture. The universal load port comprises a first set of alignment features associated with cassettes that contain 8-inch wafers and a second set of alignment features associated with cassettes that contain 12-inch wafers. By aligning the cassettes with the appropriate alignment features of the universal load port, the cassettes are located and aligned precisely, promoting the removal and return of semiconductor wafers from and to the cassettes by a robot arm of the RAD UV machine. For example, when mounting an 8-inch semiconductor wafer cassette (e.g., a cassette configured to hold 8-inch semiconductor wafers in a series of slots) onto the RAD UV machine, the 8-inch semiconductor wafer cassette is located and precisely aligned to the RAD UV machine by mating the base of the 8-inch semiconductor wafer cassette to the first set of alignment features. When mounting a 12-inch semiconductor wafer cassette (e.g., a cassette configured to hold 12-inch semiconductor wafers in a series of slots) onto the RAD UV machine, the 12-inch semiconductor wafer cassette is located and precisely aligned to the RAD UV machine by mating the base of the 12-inch semiconductor wafer cassette to the second set of alignment features.

FIG. 1A shows a system 100A that comprises an ultraviolet radiation machine 102 (i.e., a RAD UV machine) that comprises a controller 104, a robot arm 106, an ultraviolet light radiator 108, and a universal load port 110. The controller 104 may comprise one or more of a central processing unit (CPU), a digital signal processor (DSP), a microprocessor (MPU), a field programmable gate array (FPGA), a complex programmable logic device (CPLD), an application specific integrated circuit (ASIC), a microcontroller (MCU), or other semiconductor logic processor. The controller 104 may receive inputs from sensors (not shown) of the machine 102 that indicate positions of the robot arm 106 and other physical parameters of the machine 102.

As illustrated in FIG. 1A, the system 100A has a 12-inch semiconductor wafer cassette 120 containing 12-inch semiconductor wafers 122 mounted onto the universal load port 110. It is understood that FIG. 1A illustrates the components of the system 100A broadly and is not intended to represent exact physical locational and dimensional relationships. Additionally, many components of the RAD UV machine 102 that are not relevant to the present discussion, such as a user interface, are not shown in FIG. 1A.

The 12-inch semiconductor wafers 122 may have semiconductor circuits fabricated on one surface of the wafers. One surface of the wafers 122 may be covered with tape. For example, in an embodiment, the substrate surface (i.e., the surface opposite the surface onto which the semiconductor circuits have been fabricated) may be covered with tape in preparation for a sawing process to saw the semiconductor circuits into separate die. This tape may be referred to as dicing tape. The tape may be adhered to the substrate surface of the wafers 122 by an adhesive material. Alternatively, in an embodiment, the circuit side of the wafers 122 may be covered with tape in preparation for a backgrinding process to thin the wafers 122 to a desired thickness.

Under command of the controller 104, the robot arm 106 may extend into the 12-inch wafer cassette 120, grasp a 12-inch wafer 122 based on an expected predefined location and alignment of the wafer 122 based on a slot position in the cassette 120 and based on a predefined location and alignment of the cassette 120 relative to the RAD UV machine 102. The robot arm 106, under command of the controller 104, may remove the wafer 122 from the cassette 120, and take the wafer 122 into an interior area of the machine 102. While the wafer 122 is inside the machine 102, the ultraviolet light radiator 108 may be commanded by the controller 104 to radiate the wafer 122, thereby weakening an adhesive of the tape on the wafer 122. Under command of the controller 104, the robot arm 106 may pick up the wafer 122 from the inside of the machine 102 and return it to its former slot position in the cassette 120, based on the predefined location of the slot position and the predefined location of the cassette 120 relative to the machine 102. In this way, each of the 12-inch wafers 122 retained in the 12-inch wafer cassette 120 may be processed by the machine 102.

The manipulation of the 12-inch wafers 122 by the robot arm 106 is at least partially dependent on the precise physical location and alignment of the 12-inch wafer cassette 120 relative to the machine 102. This precise physical location and alignment of the 12-inch wafer cassette 120 is assured by the mating of alignment features in the base of the 12-inch wafer cassette 120 to corresponding alignment features in the universal load port 110 which are discussed more fully with reference to FIG. 2 and FIG. 3 hereafter. The 12-inch wafers 122 are about 12 inches in diameter. In an embodiment, the 12-inch wafers 122 may be about 11 mils (about 280 microns) thick, but it is understood that in other embodiments the wafers 122 may have a different thickness. Additionally, in an embodiment, the wafers 122 may have a different thickness before or after backgrinding. In an embodiment, the 12-inch wafer cassette 120 may contain 13 slots for 12-inch wafers 122, but it is understood that in another embodiment, the 12-inch wafer cassette 120 may be configured with a different number of slots.

Figure 1B:
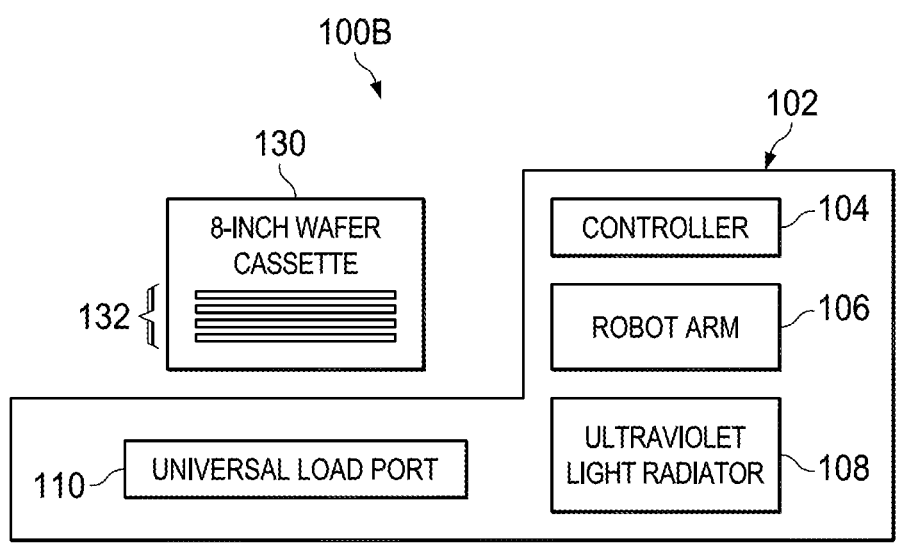

Turning now to FIG. 1B, a system 100B is described. Much of the description of system 100A applies to system 100B, but in system 100B, an 8-inch wafer cassette 130 containing 8-inch semiconductor wafers 132 is mounted onto the universal load port 110. In system 100B, the precise physical location and alignment of the 8-inch wafer cassette 130 relative to the machine 102 is assured by the mating of alignment features in the base of the 8-inch wafer cassette 130 to corresponding alignment features in the universal load port 110 which are discussed more fully with reference to FIG. 2 and FIG. 4 hereafter. The 8-inch wafers 132 are about 8 inches in diameter. In an embodiment, the 8-inch wafers 132 may be about 11 mils (about 280 microns) thick, but it is understood that in other embodiments the wafers 132 may have a different thickness. Additionally, in an embodiment, the wafers 132 may have a different thickness before or after backgrinding. In an embodiment, the 8-inch wafer cassette 130 may contain 25 slots for 8-inch wafers 132, but in another embodiment, the 8-inch wafer cassette 130 may be configured with a different number of slots.

Figure 2:
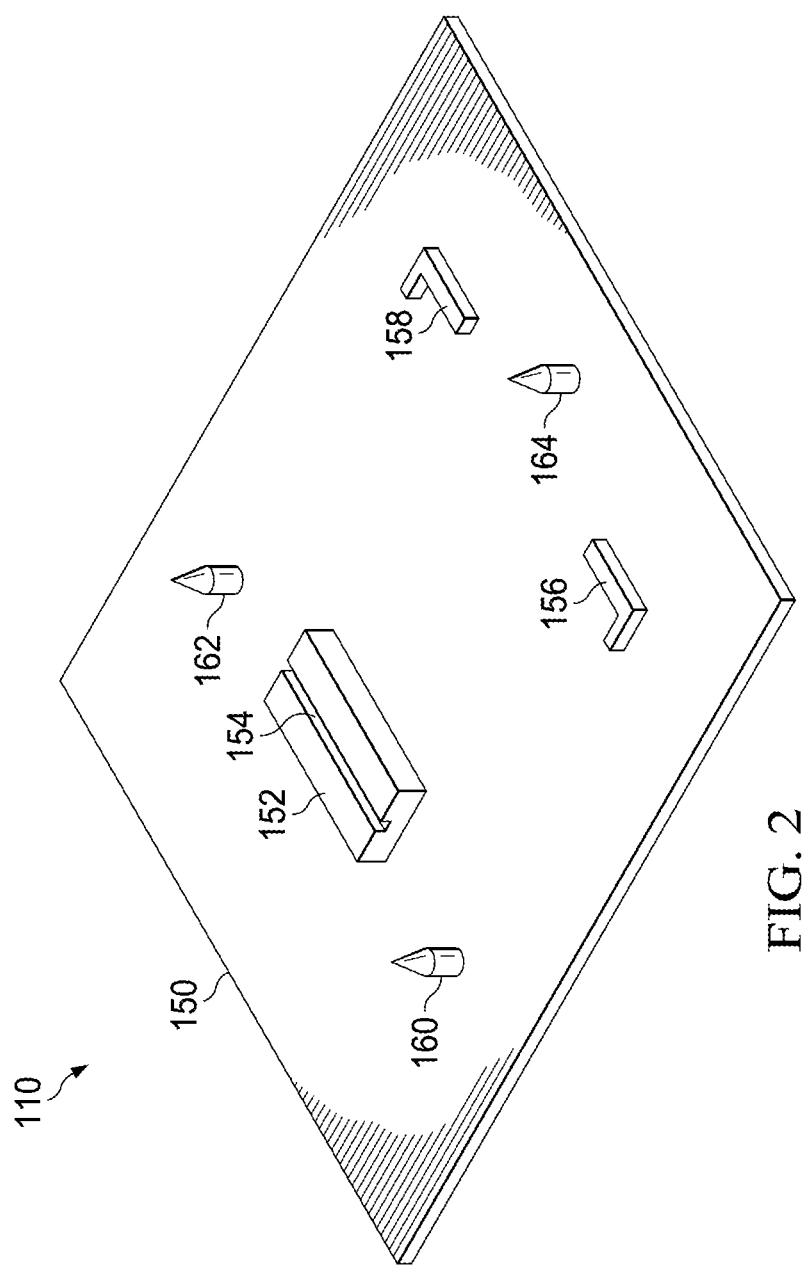
FIG. 2 shows a universal load port in accordance with various examples.

Turning now to FIG. 2, the universal load port 110 or universal load fixture is described. In an embodiment, the universal load port 110 comprises a frame 150, a first set of location and alignment features coupled to the frame 150 for mating to corresponding location and alignment features on the base of the 8-inch wafer cassette 130, and a second set of location and alignment features coupled to the frame 150 for mating to corresponding location and alignment features on the base of the 12-inch wafer cassette 120. In an embodiment, the first set of location and alignment features of the universal load port 110 (for 8-inch wafers) comprise a chuck 152 defining a groove 154, a first L-shaped bracket 156, and a second L-shaped bracket 158. In an embodiment, the second set of location and alignment features of the universal load port 110 (for 12-inch wafers) comprises a first pin 160, a second pin 162, and a third pin 164. In one embodiment, the pins 160, 162, 164 may be substantially cylindrical surmounted by a hemisphere. In another embodiment, the pins 160, 162, 164 may be substantially cylindrical surmounted by a cone that terminates in a rounded tip. The pins 160, 162, 164 may be coupled to the frame 150 or may be part of the frame 150. In an embodiment, the pins 160, 162, 164 may be formed separately and then attached to the frame 150 by friction fitting into holes in the frame 150 or adhered by adhesive such as epoxy or glue to the frame 150. The pins 160, 162, 164 may be retained to the frame 150 by screws or bolts, for example by passing the screws or bolts through a hole in an underside of the frame 150 up to the pins 160, 162, 164. In an embodiment, the frame 150, the chuck 152, the two L-shaped brackets 156, 158, and the three pins 160, 162, 164 are comprised of metal. In other embodiments, however, one or more of these components may be comprised of other materials such as ceramic materials, composite materials, plastic materials, or wood.

Figure 3:
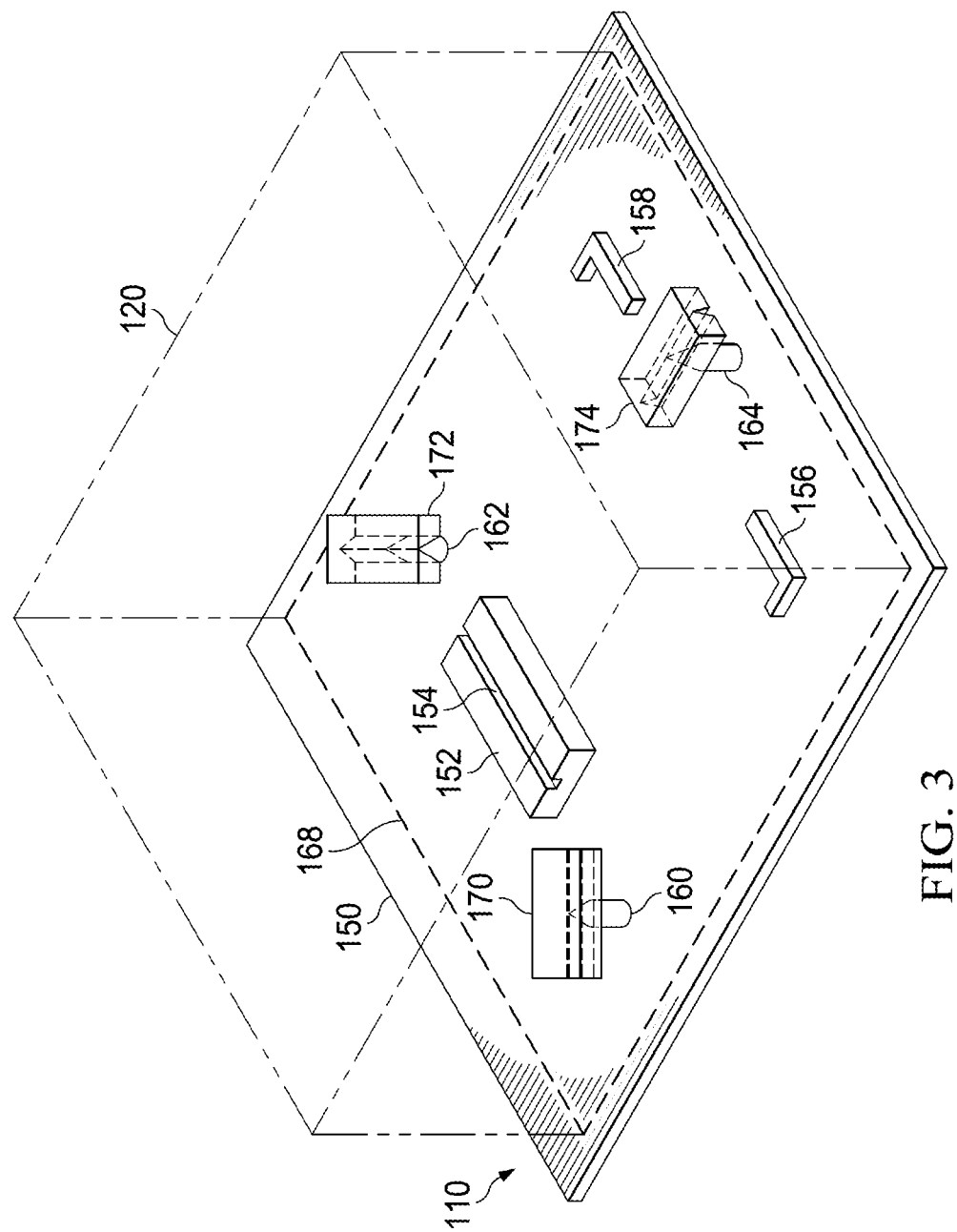
FIG. 3 shows a universal load port locating a 12-inch semiconductor wafer cassette in accordance with various examples.

Turning now to FIG. 3, the location and alignment of corresponding alignment features in the base of the 12-inch wafer cassette 120 to the pins 160, 162, 164 of the universal load port 110 are described. The 12-inch wafer cassette 120 comprises a base perimeter 168 and a first kinematic coupling feature 170, a second kinematic coupling feature 172, and a third kinematic coupling feature 174 located in a base and/or in an underside of the cassette 120. When the first kinematic coupling feature 170 mates with the first pin 160, the second kinematic coupling feature 172 mates with the second pin 162, and the third kinematic coupling feature 174 mates with the third pin 164, the 12-inch wafer cassette 120 is located and precisely aligned with the machine 102 by the universal load port 110. The pins 160, 162, 164 and the features 172, 174, 176 may be said to comprise a kinematic coupling. In an embodiment, the kinematic coupling features 170, 172, 174 are V-shaped grooved blocks. In an embodiment, the V-shaped grooved blocks may be oriented radially (i.e., the groove if extended inwardly would intersect between the blocks). The disclosed kinematic couplings are capable of providing precise alignment of components coupled via the kinematic coupling.

Figure 4:
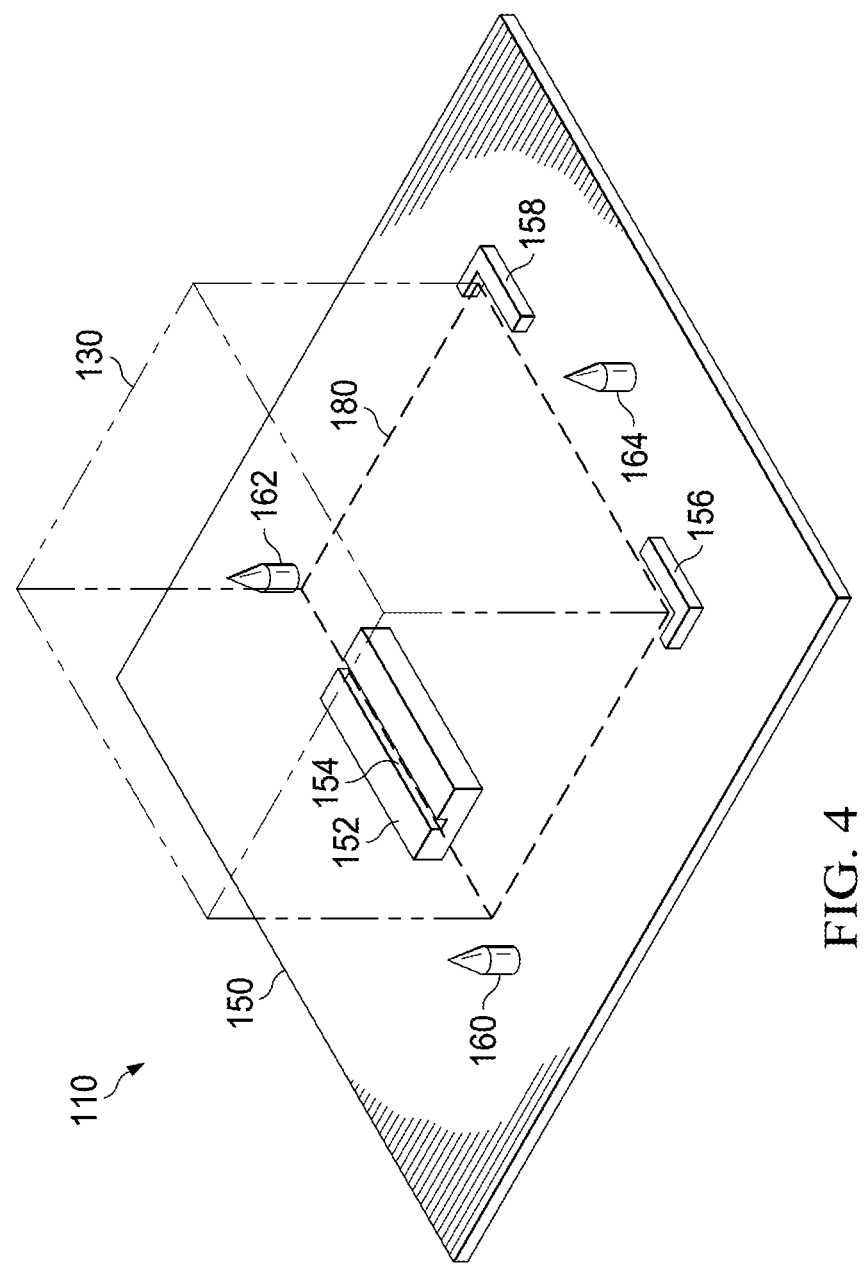
FIG. 4 shows a universal load port locating an 8-inch semiconductor wafer cassette in accordance with various examples.

Turning now to FIG. 4, the location and alignment of corresponding alignment features in the base of the 8-inch wafer cassette 130 to the groove 154 of the chuck 152 and to the L-shaped brackets 156, 158 of the universal load port 110 are described. The 8-inch wafer cassette 130 comprises a base perimeter 180 that engages with the groove 154 of the chuck 152 and that is constrained at an opposite side of the base by the two L-shaped brackets 156, 158, thereby locating and aligning the 8-inch wafer cassette 130 precisely with the machine 102.

In some embodiments, some of the spatial relationships among components of the universal load port 110 may vary from those illustrated in FIGS. 2-4. For example, the short limb of the L-shaped brackets 156, 158 may be longer. The L-shaped brackets 156, 158 may have limbs of equal length. The length or width of the chuck 152 may be larger or smaller. Additionally, a different number of location and alignment elements may be used in each set of location and alignment features. For example, in an embodiment, the location and alignment features of the 8-inch wafer cassette 130 may comprise two opposing L-shaped brackets located diagonally across the frame 150 from each other. In an embodiment, the location and alignment features of the 8-inch wafer cassette 130 may comprise a single L-shaped bracket, for example an L-shaped bracket that has two long sides or limbs, and locating and alignment of the 8-inch wafer cassette may be performed simply by sliding the cassette to fit two adjacent sides into the apex of the single L-shaped bracket. Likewise, the second set of location and alignment features (those associated with the second size semiconductor wafer cassette, for example the 12-inch semiconductor wafer cassette 120) may comprise two pins instead of three pins.

Figure 5A:
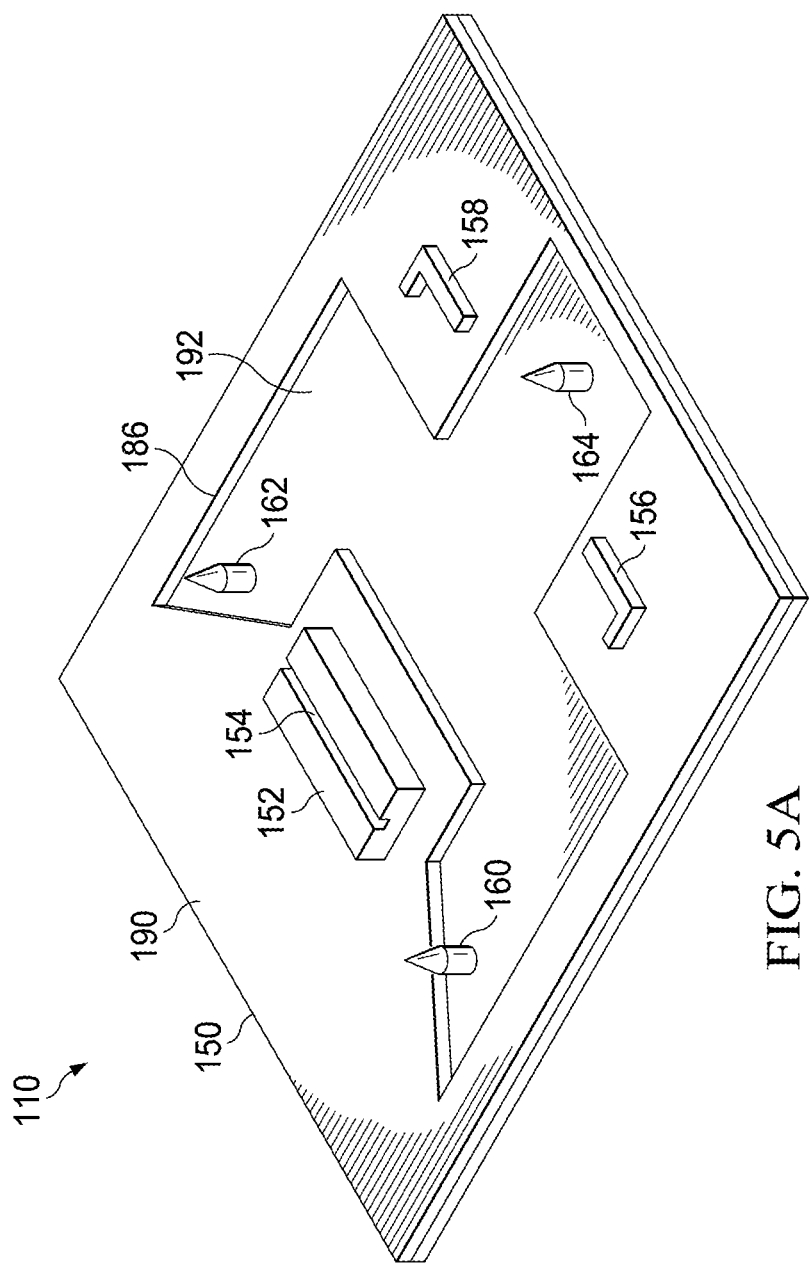
FIG. 5A shows a first view of a universal load port in accordance with various examples.
Figure 5B:
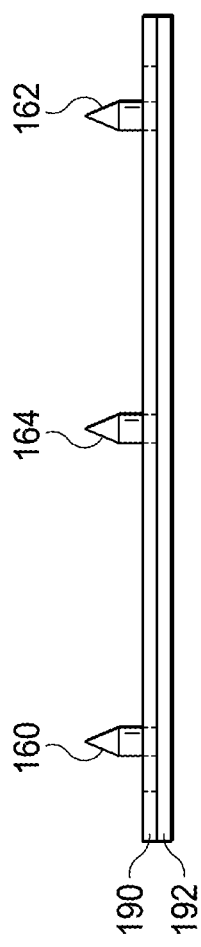
FIG. 5B shows a second view of a universal load port in accordance with various examples.

FIGS. 5A and 5B illustrate an alternative embodiment of the universal load port 110. The frame 150 comprises a first plate 190 defining an aperture 186 and a second plate 192. The first plate 190 is coupled to the second plate with screws, bolts, adhesive, spot welds, rivets, or other securing hardware. The chuck 152 and the L-shaped brackets 156, 158 are coupled to the first plate 190 and the three pins 160, 162, 164 are coupled to the second plate 192. The three pins 160, 162, 164 may be part of the second plate 192 or formed separately and then attached to the second plate 192. The aperture 186 may be formed in any of a variety of ways. The first plate 190 could be manufactured with the aperture 186 formed in it. The aperture 186 could be cut with a saw or a cutting torch after fabrication of the first plate 190. The coupling together of the first plate 190 and the second plate 192 may promote easy reuse of legacy separate load ports, for example by cutting the aperture 186 in a legacy first plate 190. In an embodiment, the use of two separate plates may promote offsets in the preferred elevation of the different sized cassettes.

Figure 6:
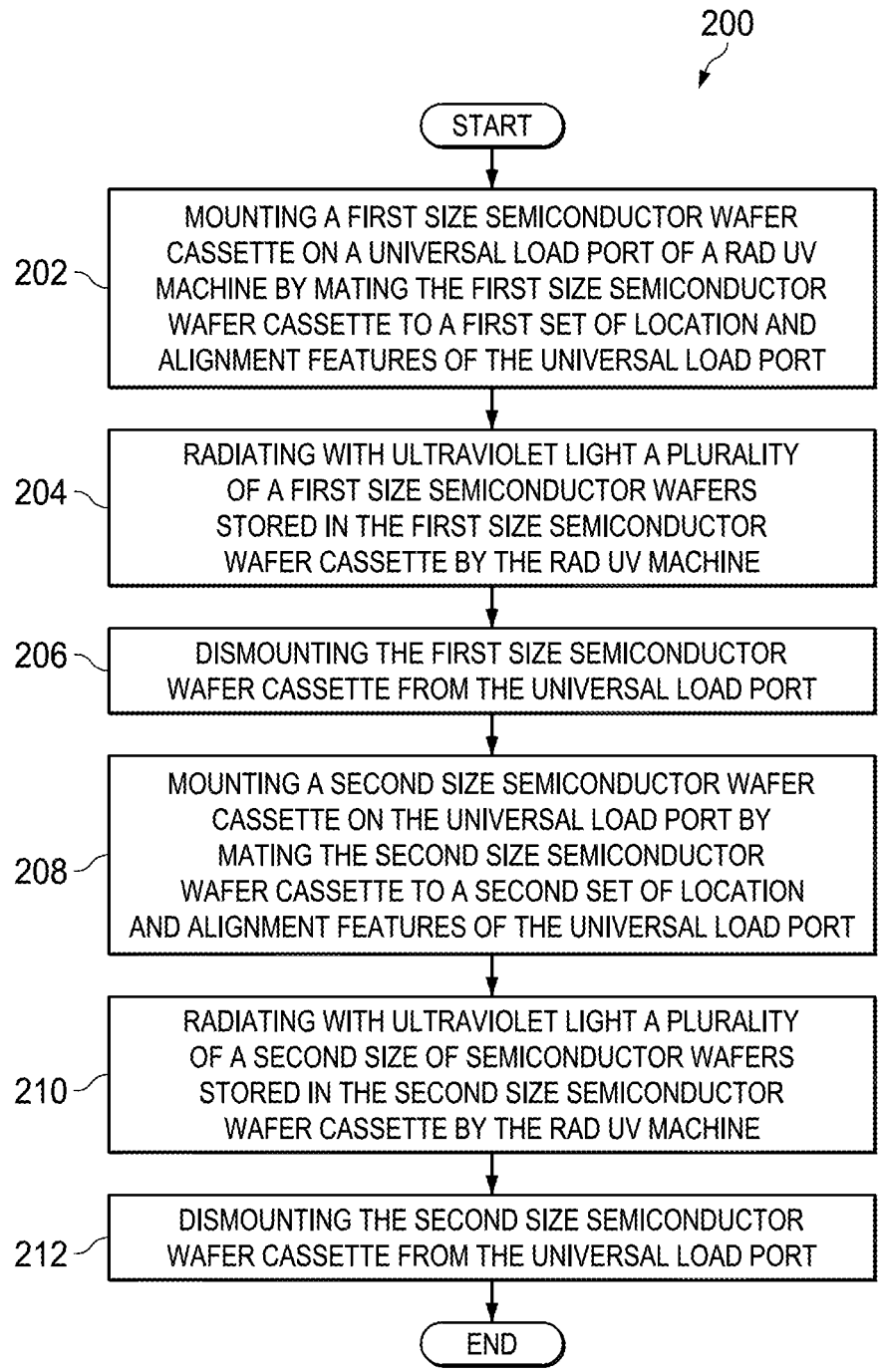
FIG. 6 shows a flow chart in accordance with various examples.

Turning now to FIG. 6, a method 200 is described. The method 200 may be used, in part, to irradiate semiconductor wafers with ultraviolet radiation to weaken an adhesive on a tape attached to a surface of the wafers. The method 200 may be used on a single RAD UV machine processing two different size semiconductor wafers, for example, processing both 8-inch semiconductor wafers and 12-inch semiconductor wafers. At block 202, a first size semiconductor wafer cassette is mounted on a universal load port of a RAD UV machine by mating the first size semiconductor wafer cassette to a first set of location and alignment features of the universal load port. This may comprise mounting an 8-inch semiconductor wafer cassette (i.e., a cassette configured to hold 8-inch semiconductor wafers) on a universal load port. The universal load port may comprise a frame, the first set of location and alignment features coupled to the frame, and a second set of location and alignment features coupled to the frame. In an embodiment, the first set of location and alignment features may comprise a first bracket coupled to the frame, a second bracket coupled to the frame, and a chuck coupled to the frame, and mounting the 8-inch semiconductor wafer cassette on the universal load port comprises mating the 8-inch semiconductor wafer cassette to the first and second brackets and the chuck of the universal load port. The first set of location and alignment features are configured to locate the first size semiconductor wafer cassette on the universal load port for access by a robot arm of an ultraviolet (UV) radiation (RAD) machine.

At block 204, a plurality of a first size of semiconductor wafers stored in the first size semiconductor wafer cassette are radiated with ultraviolet light by the RAD UV machine. This may comprise, for example, radiating with ultraviolet light a plurality of 8-inch semiconductor wafers stored in the 8-inch semiconductor wafer cassette by the RAD UV machine. At block 206, the first size semiconductor wafer cassette is dismounted from the universal load port, for example, dismounting the 8-inch semiconductor wafer cassette from the universal load port.

At block 208, a second size semiconductor wafer cassette is mounted on the universal load port by mating the second size semiconductor wafer cassette to the second set of location and alignment features of the universal load port. As explained above, the universal load port can accommodate (i.e., located and precisely align) different sized semiconductor wafer cassettes. In an embodiment, the second set of location and alignment features, mentioned above with reference to the processing at block 202, comprise three pins coupled to the frame and forming a first portion of a kinematic coupling configured to locate and align the second size semiconductor wafer cassette for access by the robot arm of RAD UV machine. In an embodiment, the second size semiconductor wafer cassette is a 12-inch semiconductor wafer cassette (i.e., a cassette configured to hold 12-inch semiconductor wafers). The processing of block 208, for example, may comprise mounting a 12-inch semiconductor wafer cassette on the universal load port by mating a second portion of the kinematic coupling of the 12-inch semiconductor wafer cassette to the first portion of the kinematic coupling provided by the three pins coupled to the frame.

At block 210, a plurality of a second size of semiconductor wafers stored in the second size semiconductor wafer cassette is radiated with ultraviolet light by the RAD UV machine, for example, radiating with ultraviolet light a plurality of 12-inch semiconductor wafers stored in the 12-inch semiconductor wafer cassette by the RAD UV machine. At block 212, the second size semiconductor wafer cassette is dismounted, for example, dismounting the 12-inch semiconductor wafer cassette from the universal load port. While the description of method 200 has used examples of 8-inch semiconductor wafer cassettes and 12-inch semiconductor wafer cassettes, it is understood that the method 200 may be employed for mounting and dismounting other combinations of two different sized semiconductor wafer cassettes.

The method 200 may further comprise the steps of the robot arm of the RAD UV machine retrieving each first size semiconductor wafer from the first size semiconductor wafer cassette from predefined slot locations within the first size semiconductor wafer cassette and returning each wafer to its appropriate slot location after being radiated. The method 200 may further comprise the steps of the robot arm of the RAD UV machine retrieving each second size semiconductor wafer from the second size semiconductor wafer cassette from predefined slot locations within the second size semiconductor wafer cassette and returning each wafer to its appropriate slot location after being radiated. It is understood that the predefined slot locations of the first size semiconductor wafer cassette may be different locations and different in numbers of slots than the predefined slot locations of the second size semiconductor wafer cassette.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor cassette universal load port, comprising:
    a frame;
    three pins that are part of the frame forming a first portion of a kinematic coupling system configured to mate only a 12-inch semiconductor wafer cassette for access by a robot arm;
    a first bracket that is part of the frame;
    a second bracket that is part of the frame; and
    an unmovable chuck having a groove that is part of the frame, wherein the first and second brackets and the groove of the chuck are configured to mate a base perimeter of only an 8-inch semiconductor wafer cassette for access by the robot arm.

2. The universal load port of claim 1, wherein the first and second brackets are metal.

3. The universal load port of claim 2, wherein the first and second brackets are L-shaped brackets.

4. The universal load port of claim 3, wherein the chuck defines the groove, wherein the 8-inch semiconductor wafer cassette is located by fitting in the groove of the chuck and fitting in an interior apex of each of the first and second brackets.

5. The universal load port of claim 1, wherein the first portion of the kinematic coupling is configured to mate to a corresponding set of three V-shaped grooved blocks coupled to the 12-inch semiconductor wafer cassette.

6. The universal load port of claim 5, where the three V-shaped grooved blocks are oriented radially.

7. The universal load port of claim 1, wherein the three pins are metal.

8. The universal load port of claim 1, wherein the frame comprises a first metal plate coupled to a second metal plate, the brackets and the chuck are coupled to the first metal plate, the first metal plate defines an aperture, the three pins are coupled to the second plate, and the three pins project into the aperture.

9. A method of irradiating semiconductor wafers with ultraviolet radiation to weaken adhesive of a tape on a surface of the wafers, comprising:
    mounting an 8-inch semiconductor wafer cassette on a universal load port, wherein the universal load port comprises a frame, a first bracket that is part of the frame, a second bracket that is part of the frame, an unmovable chuck having a groove that is part of the frame, wherein the first and second brackets and the groove of the unmovable chuck are configured to mate a base perimeter of only 8-inch semiconductor wafer cassettes for access by the robot arm of an ultraviolet radiation (RAD UV) machine, and three pins that are part of the frame for forming a first portion of a kinematic coupling configured to mate only 12-inch semiconductor wafer cassettes for access by the robot arm of the RAD UV machine, and wherein mounting the 8-inch semiconductor wafer cassette on the universal load port comprises mating the 8-inch semiconductor wafer cassette to the first and second brackets and the unmovable chuck of the universal load port;
    radiating with ultraviolet light a plurality of 8-inch semiconductor wafers stored in the 8-inch semiconductor wafer cassette by the RAD UV machine;
    dismounting the 8-inch semiconductor wafer cassette from the universal load port;
    mounting a 12-inch semiconductor wafer cassette on the universal load port by mating a second portion of the kinematic coupling of the 12-inch semiconductor wafer cassette to the first portion of the kinematic coupling provided by the three pins coupled to the frame;
    radiating with ultraviolet light a plurality of 12-inch semiconductor wafers stored in the 12-inch semiconductor wafer cassette by the RAD UV machine;
    dismounting the 12-inch semiconductor wafer cassette from the universal load port; and
    separating the semiconductor wafers into separate die.

10. The method of claim 9, wherein the radiating of the 8-inch wafers stored in the 8-inch semiconductor wafer cassette is performed and the radiating of the 12-inch wafers stored in the 12-inch semiconductor wafer cassette without removing or replacing the universal load port.

11. The method of claim 9, wherein the first and second brackets are L-shaped brackets, the chuck defines the groove, and mating the 8-inch semiconductor wafer cassette to the first and second brackets and the chuck comprises fitting the 8-inch semiconductor wafer cassette in the groove of the chuck and fitting in an interior apex of each of the first and second brackets.

12. The method of claim 9, further comprising:
    the robot arm of the RAD UV machine retrieving each 8-inch semiconductor wafer from the 8-inch semiconductor wafer cassette and moving the 8-inch semiconductor wafer inside the RAD UV machine before the radiating is performed on the 8-inch semiconductor wafer; and
    the robot arm of the RAD UV machine retrieving each 12-inch semiconductor wafer from the 12-inch semiconductor wafer cassette and moving the 12-inch semiconductor wafer inside the RAD UV machine before the radiating is performed on the 12-inch semiconductor wafer.

13. The method of claim 12, wherein retrieving 8-inch semiconductor wafers comprises retrieving wafers from predefined slot locations within the 8-inch semiconductor wafer cassette and retrieving 12-inch semiconductor wafers comprises retrieving wafers from predefined slot locations within the 12-inch semiconductor wafer cassette.

14. The method of claim 12, further comprising the robot arm of the RAD UV machine returning each 8-inch semiconductor wafer to the 8-inch semiconductor wafer cassette after radiating is performed on the 8-inch semiconductor wafer, wherein the retrieving from and returning each 8-inch semiconductor wafer is performed by the robot arm based on the location and alignment of the 8-inch semiconductor wafer cassette.

15. The method of claim 12, further comprising the robot arm of the RAD UV machine returning each 12-inch semiconductor wafer to the 12-inch semiconductor wafer cassette after radiating is performed on the 12-inch semiconductor wafer, wherein the retrieving from and returning each 12-inch semiconductor wafer is performed by the robot arm based on the location and alignment of the 12-inch semiconductor wafer cassette.

16. The method of claim 9, wherein the frame comprises a first metal plate coupled to a second metal plate, the brackets and the chuck are coupled to the first metal plate, the first metal plate defines an aperture, the three pins are coupled to the second plate, and the three pins project into the aperture.

17. An ultraviolet radiation (RAD UV) machine, comprising:
   an ultraviolet light source;
   a robot arm; and
   a semiconductor cassette universal load port comprising:
      a frame;
      a first set of mating and alignment features coupled to the frame, where the first set of mating and alignment features are configured to mate and align only a first size semiconductor wafer cassette for access by the robot arm; and
      a second set of mating and alignment features coupled to the frame, the second set of mating and alignment features including an unmovable chuck having a groove, where the groove of the unmovable chuck is configured to mate and align a base perimeter of only a second size semiconductor wafer cassette for access by the robot arm.

18. The RAD UV machine of claim 17, wherein the first set of locating and alignment features comprises three pins coupled to the frame forming a first portion of a kinematic coupling system configured to locate and align the first size semiconductor wafer cassette.

19. An ultraviolet radiation (RAD UV) machine, comprising:
   an ultraviolet light source;
   a robot arm; and
   a semiconductor cassette universal load port comprising:
      a frame;
      a first set of mating and alignment features coupled to the frame, where the first set of mating and alignment features are configured to mate and align only a first size semiconductor wafer cassette for access by the robot arm; and
      a second set of mating and alignment features coupled to the frame, the second set of mating and alignment features including an unmovable chuck having a groove where the groove of the unmovable chuck is configured to mate and align a base perimeter of only a second size semiconductor wafer cassette for access by the robot arm;
   wherein the second set of mating and alignment features also comprises a first bracket coupled to the frame and a second bracket coupled to the frame.

20. The RAD UV machine of claim 17, wherein the first size semiconductor wafer cassette is a 12-inch semiconductor wafer cassette and the second size semiconductor wafer cassette is an 8-inch semiconductor wafer cassette.

\* \* \* \* \*